United States Patent [19]

Gilbert et al.

[11] Patent Number: 4,651,019
[45] Date of Patent: Mar. 17, 1987

[54] DUAL FUELED THERMOELECTRIC GENERATOR

[75] Inventors: Jeffrey G. Gilbert, Orefield; Alan G. Richenbacher, Coply, both of Pa.; Eugene R. Smar, Rockville, Md.

[73] Assignee: Pennsylvania Power & Light Company, Allentown, Pa.

[21] Appl. No.: 672,477

[22] Filed: Nov. 16, 1984

[51] Int. Cl.$^4$ ............................................. H02J 0/00
[52] U.S. Cl. ...................................... 307/43; 307/44; 307/56; 307/64; 322/2 R
[58] Field of Search ...................... 307/43, 44, 56, 64; 322/2 R

[56] References Cited

U.S. PATENT DOCUMENTS

| | | | |
|---|---|---|---|
| 3,225,208 | 12/1965 | Wolfe | 307/43 |
| 3,389,303 | 6/1968 | Tenenbaum | 317/22 |
| 3,489,346 | 1/1970 | Howard | 236/9 |
| 3,506,841 | 4/1970 | Majkrzak | 290/2 |
| 3,614,461 | 10/1971 | Speer et al. | 307/64 |
| 3,636,368 | 1/1972 | Sia | 307/66 |
| 3,670,175 | 6/1972 | Zinck-Peterson | 307/64 |
| 4,161,650 | 7/1979 | Caonette et al. | 250/199 |
| 4,368,416 | 1/1983 | James | 322/2 R |

OTHER PUBLICATIONS

R. Blais, "Supplying Fixed and Stroboscopic Light Beacons from the Overhead Ground Wire on 735 kV Transmission Lines, IEEE Transactions on Power Apparatus and Systems", vol. PAS-99, No. 1, Jan./Feb. 1980.

R. Berthiaume, "Microwave Repeater Power Supply Tapped From the Overhead Ground Wire on 735 kV Transmission Lines", IEEE Transactions on Power Apparatus and Systems, vol. PAS-99, No. 1, Jan./Feb. 1980.

Primary Examiner—Patrick R. Salce
Assistant Examiner—Mark D. Simpson
Attorney, Agent, or Firm—Ratner & Prestia

[57] ABSTRACT

A dual fueled thermoelectric generator wherein two different sources of energy are provided. The first source of energy is electrical energy which is tapped from an overhead transmission ground wire and converted into thermal energy by electric resistance heaters. The thermal energy produced is applied to a thermopile which converts it into DC electric energy. The second source is a fossil fuel which is converted into thermal energy when a burner is actuated. The thermal energy produced thereby is applied to a thermopile. The burner is actuated in response to either a loss of input voltage from the transmission ground wire or loss of output power from the thermopile. The fossil fuel is preferably propane and the output of the thermopile may be supplied to distributed loads, such as distributed fiber optic repeaters.

36 Claims, 5 Drawing Figures

DUAL FUELED THERMOELECTRIC GENERATOR

BACKGROUND OF THE INVENTION

A. Field of the Invention

This invention relates to the field of backup electrical power sources and in particular to electrical power sources using a thermopile.

B. Background Art

Electric power transmission towers offer a very promising, already existing way to distribute optical fiber communications. However, this method suffers from a major limitation. Fiber optic systems require repeaters to regenerate signals in order to communicate over large distances. These repeaters contain active electronics which must be powered from an external source.

Several sources of power for these optical repeaters have been developed but each has major drawbacks. For example, a dedicated power distribution line may be constructed to power the optical repeaters. However, these power lines have costs of several tens of thousands of dollars per mile, making a fiber optic communication system of any significant distance powered this way economically prohibitive. Furthermore, use of this type of power source does not provide any backup when supply from the power line is interrupted.

Optical repeaters may be powered by supply conductors within the optical cable itself. This technique has been used in undersea optical cable installations where other forms of power are unavailable. This significantly increases cable costs, especially if a second set of power conductors is required to increase the reliability of the supply.

Alternate energy sources such as photovoltaic arrays or wind turbine generators may be used to eliminate reliance on power distribution lines. Unfortunately, these sources are highly variable in the best of locations and may be completely unsuitable in many locations. Even where solar energy and wind are available in abundance, provisions must be made to supply energy for the repeater when these sources are unavailable. Battery backup systems are useful, but they have high initial expense and must be frequently maintained to insure continued reliability.

Also, thermoelectric generators may be used. Thermoelectric generators using gaseous fossil fuels have been commercially available for many years as, for example, the fossil fuel thermoelectric generator produced by Global Thermoelectric Power Systems Ltd. These generators provide a direct current output by heating a junction of dissimilar conductor materials through combustion of a gaseous fuel. Use of this principal is particularly attractive because these generators have few moving parts, long service life, and proven reliability. They also provide protection from the input transient phenomenon which may occur on the utility distribution line since use of the distribution line is avoided. However, if this method of heating the thermoelectric junction were used alone, the tanks storing the gaseous fuels would have to be refilled or replaced periodically causing great inconvenience, since many distributed loads may be in isolated areas.

A way to obtain power for small distributed loads from the utility transmission line at low cost was taught in *Supplying Fixed and Stroboscopic Light Beacons from the Overhead Ground Wire on 735 kV Transmission Lines*, by R. Blais, IEEE Transactions on Power Apparatus and Systems, Vol. PAS-99, No. 1 Jan./Feb. 1980. In power transmission lines, there is normally an overhead ground wire which links the tips of the towers to protect the line conductor bundles from lightning. The wire is normally grounded and is not used to carry electrical energy. However, a certain amount of energy is coupled to this overhead ground wire. If a predetermined length of the ground wire was isolated from the rest, it was possible to tap this energy without affecting the primary function of the wire. The power which may be tapped by this method was normally unused and wasted. The isolated section of ground wire was coupled through the primary of a transformer to ground.

Blais teaches the use of energy obtained in this manner to power the beacons on towers which are required for the protection of aircraft. In the same issue of the IEEE Transactions, Berthiaume teaches the use of the same method of tapping power to energize microwave network repeater stations in remote areas. *Microwave Repeater Power Supply Tapped from the Overhead Ground Wire on 735 kV Transmission Lines*. However, both Blais and Berthiaume have the disadvantage that they are still dependent upon the energy normally carried by the utility transmission system to capacitively induce energy in the section of overhead ground wire which is used to power a distributed load such as a beacon or a microwave repeater.

The energy normally carried by the utility transmission system is interruptable and unreliable for a variety of reasons. Overvoltage conditions can damage repeater circuits. Storms, floods, or lightning may damage the towers or the power transmission lines themselves. Additionally, system overloads, equipment failure and human error may cause blackouts or brownouts. Any event which interrupted power transmission would, of course, interrupt communication links dependent upon the power for energizing repeaters.

A way to increase power supply reliability is to provide a backup source which is activated when a primary source fails. One method of switching from a primary power source to a backup is described in U.S. Pat. No. 3,636,368, issued Jan. 18, 1972 to Joseph B. Sia, titled *Transfer Switch and Generator Control Means, and New and Improved Method of Operation Thereof*. Sia teaches the automatic transfer of a load from the power line to a backup generator. When the line voltage sensor detected a voltage below a predetermined threshold, the generator was activated. Disadvantages here were the cost of the power delivered to the load from the power line, the cost and unreliability of the generator, and interruption of power due to generator startup time.

Other patents of interest found in a brief patentability search of the present invention include: U.S. Pat. No. 4,161,650, which relates to a self-powered fiber optic interconnect system; U.S. Pat. No. 3,670,175, which teaches supplying electric energy alternately from a voltage line and a rotating electric generator; U.S. Pat. Nos. 3,614,461, 3,489,346, and 3,389,303, which relate to circuitry for control of a power supply from a primary AC source to a substitute source upon failure of the primary; and U.S. Pat. No. 3,506,841, which relates to the use of propane vapor in a power pack for long-term unattended operation.

It is, therefore, an object of this invention to provide a reliable source of electrical energy for distributed loads such as repeaters for a fiber optic communication system.

An additional object is to provide a thermoelectric generator with an auxiliary source of thermal energy.

SUMMARY OF THE INVENTION

A dual fueled thermoelectric generator wherein two different sources of energy are provided. The first source of energy is electrical energy which is tapped from an overhead transmission ground wire and converted into thermal energy by electric resistance heaters. The thermal energy produced is applied to a thermopile which converts it into DC electric energy. The second source is a fossil fuel, which is converted into thermal energy, which is also applied to the thermopile when a burner is actuated. The burner is actuated in response to a predetermined event such as a loss of input energy from the transmission ground wire, a loss of output energy from the thermopile, or an excess of electric energy from the thermopile.

DETAILED DESCRIPTION OF THE INVENTION

Figure 1:
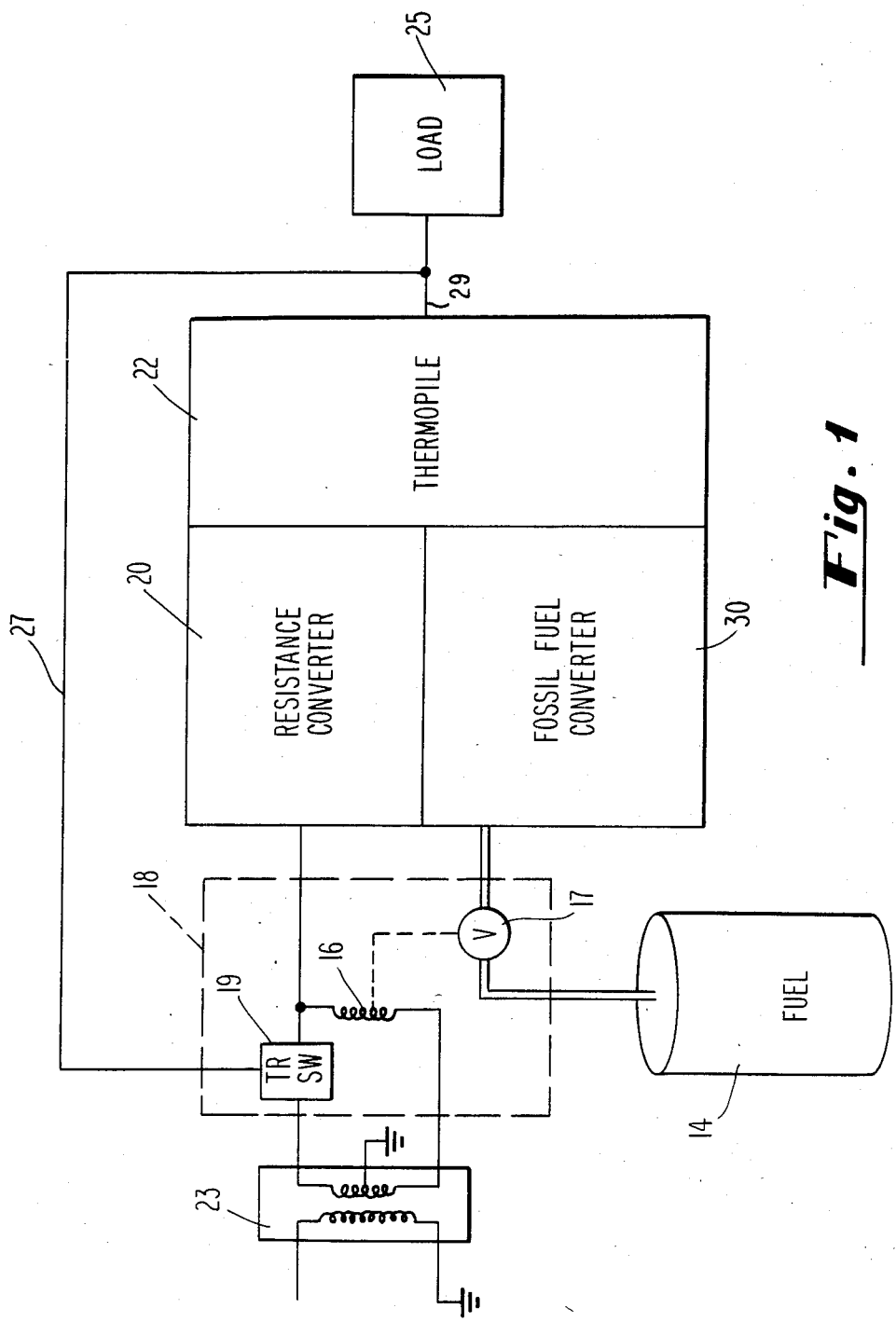
FIG. 1 is a block diagram of the dual fueled thermoelectric generator of the present invention.

Referring now to FIG. 1 there is shown a block diagram of Dual Fueled Thermoelectric Generator (DFTEG) System 10. DFTEG system 10 includes thermopile 22 which converts thermal energy into DC electrical energy and may be used to supply electrical energy at output 29 to a distributed load 25 such as a repeater for a fiber optic communication system. DFTEG 10 has two converters 20, 30 which convert different energy sources into thermal energy. Thermopile 22 converts the thermal energy produced by the converters into DC electrical energy. First converter 20 supplies thermal energy to thermopile 22 under normal operating conditions. Upon actuation of switching system 18, fuel control valve 17 opens supplying fuel from tank 14 to second converter 30. Second converter 30 then supplies thermal energy to thermopile 22.

First converter 20 is an electric resistance heater network which converts electric energy from the secondary of transformer 23 into thermal energy. The secondary of transformer 23 also energizes winding 16 of switching system 18. The primary of transformer 23 is coupled to a source of electric energy, such as an overhead ground wire segment 72 (FIG. 2) of an electric transmission line. Second converter 30 is a fossil fuel burner which receives fuel from a source such as tank 14 upon actuation of control valve 17. Switching system 18 actuates valve 17 in response to a predetermined low voltage at the secondary of transformer 23 which is detected by loss of power in winding 16. Additionally, either a predetermined high voltage level or a predetermined low voltage level at output 29, coupled to trip switch 19 of switching system 18 by feedback line 27, will cause switching system 18 to actuate control valve 17.

Figure 2:
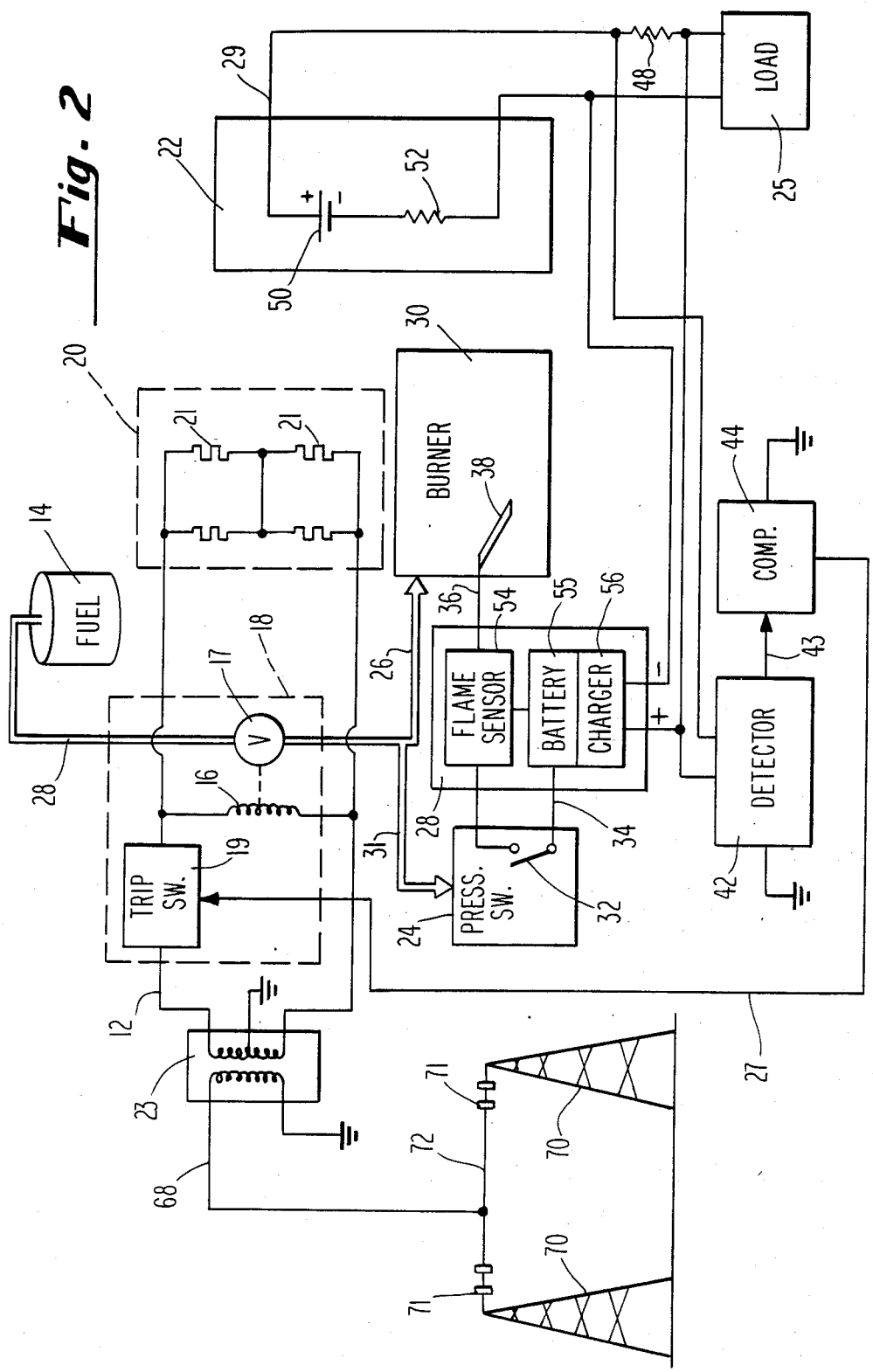
FIG. 2 is a more detailed schematic representation of the system of FIG. 1.

Referring now to FIG. 2, additional details of DFTEG System 10 are shown in schematic form. The input 12 of first converter 20 is energized from the secondary of transformer 23. The primary of transformer 23 is coupled by lead wire 68 to a one-span segment 72 of an overhead ground wire.

As described in Blais and Berthiaume, conventional power transmission lines (not shown), which are supported by towers 70, are protected from lightning by an overhead ground wire. Energy is capacitively induced in the overhead ground wire because of its proximity to transmission lines. If a segment 72 of predetermined length of an overhead ground wire is isolated from the rest, it is possible to tap the induced energy without affecting the primary function of the wire which is to protect the transmission lines. Segment 72 may be a single span or a plurality of spans and is isolated from the remainder of the overhead ground wire by porcelain insulators 71. The energy tapped from the ground wire is supplied the primary of transformer 23 by lead 68 and through the secondary of transformer 23 to input 12 of DFTEG System 10. Thus, first converter 20 is energized from the transmission lines and is therefore interruptable when there is a utility system failure.

Second converter 30 of thermal energy is a fossil fuel burner such as a propane burner. Switching system 18 opens valve 17 when predetermined voltage conditions are detected at input 12 or at output 29 thereby causing fuel to be supplied from fuel tank 14 to gas burner 30. Switching system 18 contains a solenoid winding 16, a trip switch 19, and valve 17. Gas burner 30 is caused to ignite by the opening of valve 17 and the thermal energy produced by gas burner 30 is applied to thermopile 22 and is therein converted into DC electrical energy. Fuel tank 14 may be supplemented by one or more additional tanks of fossil fuel to provide a larger supply of fuel. If a plurality of fuel tanks is provided for DFTEG system 10, conventional means such as float valves and check valves may be used to switch from one tank to another as tanks are emptied. Fuel tank 14 and gas burner 30 thus function as an auxiliary source of thermal energy for thermopile 22 and provide approximately 100 watts when activated.

Figure 3:
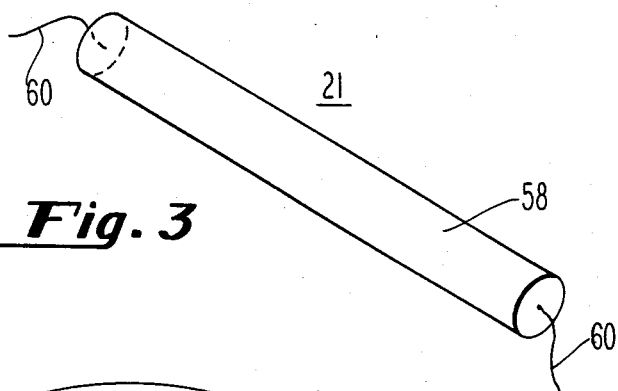
FIG. 3 is a perspective view of the electric resistance heater of the system of FIG. 1.

The two converters for thermopile 22, therefore, are heater network 20 and backup gas burner 30. Heater network 20 includes four electric resistance heaters 21 connected in series and in parallel. A physical representation of resistance heater 21 is shown in FIG. 3. Resistance heater 21 has a tubular body 58 and two leads 60 which are used to interconnect a plurality of resistance heaters 21 and to energize a heating element within body 58. Each resistance heater 21 has a resistance of approximately 54 ohms and the total resistance of heater network 20 is approximately 27 ohms. At the minimal input voltage of 240 volts at input 12 heater network dissipates a minimum of approximately 2133 watts.

Figure 4:
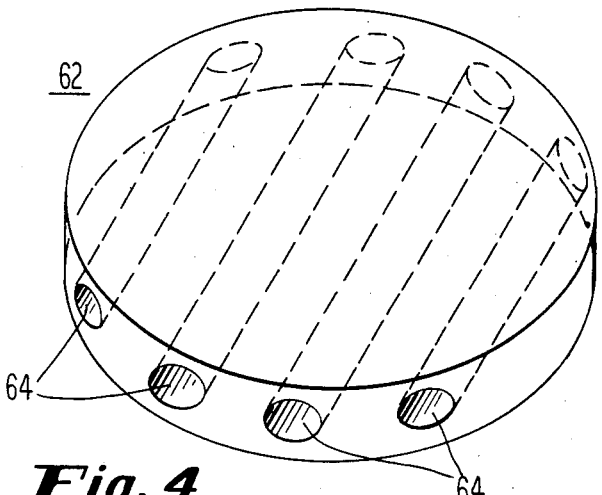
FIG. 4 is the plate which receives the electric resistance heater of FIG. 3.

In order to evenly distribute the thermal energy produced by resistance heaters 21 and to transfer this thermal energy to thermopile 22, resistance heaters 21 are fitted into a copper plate 62 shown in FIG. 4. Copper plate 62 has a plurality of tubular holes 64 extending entirely through copper plate 62 which receive resistance heaters 21. When a resistance heater 21 is inserted into copper plate 62 the leads 60 extend outwardly beyond hole 64 at each end and are connected as appropriate to implement heater network 20.

Returning to FIG. 2, the ends of solenoid winding 16 are electrically coupled to the leads of input 12 causing a magnetic field to be produced around winding 16 when input 12 is energized. When the voltage across winding 16 falls below a predetermined threshold, causing a collapse of the magnetic field and indicating a loss of power at input 12, mechanical coupling to valve 17 opens valve 17. When this occurs, fuel is supplied from fuel supply tank 14 through fuel supply line 28 and through fuel supply line 26 to burner 30. When fuel is thus supplied through supply line 26, the pressure in fuel line 31 rises causing contacts 32 within pressure switch 24 to close. When contacts 32 between electrical lines 34 are closed, ignitor unit 28 causes a signal to pass to flame ignitor electrode 38 through line 36 thereby igniting burner 30. Igniter unit 28 contains a flame sensor 54, a battery 55, and a battery charger 56. Battery 55 applies a potential to ignite electrode 38 when switch 32 is closed. Battery charger 56, coupled to output 29, trickle charges battery 55. Flame sensor 54 is a conventional flame sensor which operates by detecting the presence of hot gases from burner 30.

Thus, burner 30 is actuated to supply thermal energy to thermopile 22 as an auxiliary to the thermal energy normally supplied by heater network 20. The fossil fuel which fuel supply tank 14 contains is preferably propane and burner 30 is a conventional propane gas burner designed to operate on a 4-6 psi propane fuel source.

In a similar manner, burner 30 is actuated in response to detection of a predetermined low voltage at output 29. The voltage across resistor 48 at output 29 is coupled to power detector 42 which amplifies the received signal, proportional to output current, and multiplies it by the output voltage. A signal proportional to this product is supplied on line 43 and applied to comparator 44. Comparator 44 compares the signal received from detector 42 with an internal predetermined low value. When the received signal falls below a predetermined low value, a feedback signal is applied to trip switch 19 on feedback line 27. When trip switch 19 receives this signal from comparator 44, an open circuit is produced between input 12 and solenoid winding 16 causing solenoid winding 16 to be deenergized. This initiates the same process as described for loss of power from the overhead ground wire segment 72, thereby causing thermal energy from gas burner 30 to be applied to thermopile 22.

Comparator 44 also protects DFTEG system 10 from an overvoltage condition on ground wire segment 72. If the voltage on ground wire segment 72 rises, the temperature of resistor network 20 rises. Since the output of thermopile 22 is directly proportional to the thermal energy applied to it, the power level at output 29 also rises. Comparator 44 compares the signal it receives from the output of thermopile 22 on line 43 with a predetermined high level as well as the predetermined low level. When the received signal rises above the predetermined high level, comparator 44 applies a feedback signal to trip switch 19 in the same manner as previously described for the low voltage condition. This causes trip switch 19 to open, winding 16 to be deenergized, and valve 17 to open. Thus, DFTEG system 10 is switched from the electric source to the fossil fuel source.

As shown in FIG. 2, thermopile 22 may be conceptualized as a DC power source 50 and an internal resistance 52. DC power source 50 is a plurality of semiconductor thermocouples each having a bulk resistance collectively modeled as resistance 52.

Figure 5:
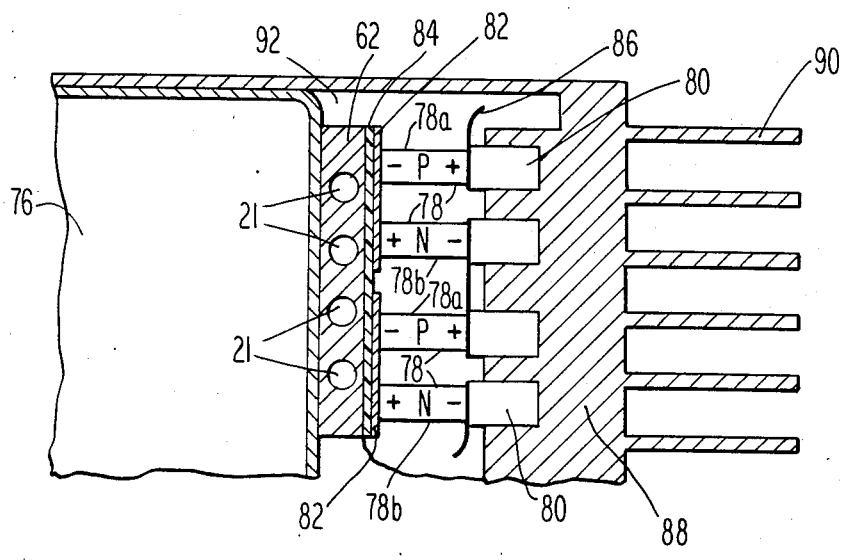
FIG. 5 shows a portion of the thermopile of the system of FIG. 1 with the plate of FIG. 4 and a portion of the gas burner.

Referring now to FIG. 5, a portion of thermopile 22 is shown in more detail with a side view of copper plate 62 and combustion chamber 76 of burner 30. It is in combustion chamber 76 that the combustion of propane gas by burner 30 occurs. Thermal energy from combustion chamber 76 is transmitted through copper plate 62 to thermocouples 78. It should be noted that while FIG. 5 shows a single thermopile 22 receiving thermal energy from both combustion chamber 76 and resistor heaters 21, DFTEG 10 may contain two thermopiles 22, connected in parallel, one receiving thermal energy from combustion chamber 76 and one receiving thermal energy from resistor heaters 21. In this way, backup may be provided. If a first thermopile 22 receiving thermal energy from resistance heaters 21 fails, gas burner 30 would be activated to provide thermal energy to a second thermopile 22. If two thermopiles 22 are used, there must be a regulator on the output of each to switch the unused thermopile 22 from load 25 to a load resistor (not shown) in order to prevent overheating. There should also be a diode in the output of each thermopile to prevent one thermopile from feeding energy into the output of the other. Furthermore, while only two thermocouples 78 are shown in FIG. 5, thermopile 22 may contain as many thermocouples 78 as necessary, connected in series and in parallel, to produce the required voltage and current. Thermopile 22 can normally supply DC power between 80 and 130 watts.

Each thermocouple 78 has a P-type semiconductor material thermoelectric leg 78a and an N-type semiconductor material thermoelectric leg 78b. The two thermoelectric legs 78a,b of each thermocouple 78 are connected by a conductor 82. The conductors 82 are separated from copper plate 62 by layer 84. The thermal energy supplied by both resistance heater network 20 and combustion chamber 76 is applied to thermocouples 78 through copper plate 62 and conductors 82. Conductors 82 are therefore referred to as hot junction electrodes. Layer 84 is formed of an electrically insulating material which can withstand high temperatures, for example, Mica.

At the ends of thermoelectric legs 78a,b opposite conductors 82 are conductors 86. Conductors 86 connect thermocouples 78 in series and/or in parallel as necessary to get the required voltage and current. In the portion of thermopile 22 shown in FIG. 5, the two thermocouples 78 are shown connected in series.

Coupled to electrodes 86 and embedded in heat sink 88 are fasteners 80. Fasteners 80 serve to secure thermoelectric legs 78a,b to heat sink 88 and to transfer heat from legs 78a,b to heat sink 88 in order to dissipate the heat, especially through cooling fins 90. Conductors 86 are therefore referred to as the cold junction electrodes. Thermal insulation chamber 92 is filled with a thermal insulation material such as argon gas or a metallic oxide. Thus a large temperature difference may be maintained between the hot junction electrodes and the cold junction electrodes of thermopile 22. When such a temperature difference is maintained between the junctions of two homogeneous but dissimilar materials (i.e., the P-type and the N- type materials) a DC electromotive force proportional to the heat difference is produced. This is known as the thermoelectric effect. The temperature of combustion chambers 76 is approximately 538° C. and the temperature of cooling fins 90 is approximately 163° C.

Although the invention has been particularly shown and described with reference to a preferred embodiment thereof, it will be understood by those skilled in the art that various changes may be made therein without departing from the spirit or scope of the invention. For example, more than two thermopiles may be provided and a plurality of fuel tanks may be provided, along with valves to switch from one tank to another. Fossil fuels other than propane may be used and, if a plurality of tanks is provided, the tanks may contain different fossil fuels. Additionally, sources of electric energy other than an overhead ground wire may be used. For example, solar energy, wind energy or a tap of the transmission lines themselves may be used.

In dual fueled thermoelectric generator system 10, the following components have been used for the operation and function as described and shown:

| Reference Numeral | Type |
|---|---|
| 16, 17 | Skinner, V55DA225 |
| 19 | KUP11A15, Potter and Brumfield, AMF, Indiana |
| 21 | Watlow, G3AX644A Skinner Valve Div., Honeywell |
| 42 | MC1594L, LM324 (four) |
| 44 | LM111JC (two), 2N2222 (four), MP5U45, MC14093B |
| 22, 24, 30, 54, 55, 56 | Standard Model 5120, Global Power Systems, Ltd., Sassano, Alberta, Canada |

We claim:

1. A dual fueled thermoelectric generator system using first and second sources of energy which are separate and different in kind from each other and having at least one thermopile producing DC electrical energy from thermal energy comprising:
   first means for converting the first source of energy into thermal energy and applying the thermal energy to said thermopile;
   second means operable for converting the second source of energy into thermal energy and applying the thermal energy to said thermopile; and
   means for actuating the second converting means to begin converting the second source of energy into thermal energy.

2. The dual fueled thermoelectric generator system of claim 1 including means for detecting a predetermined event for operating the actuating means.

3. The dual fueled thermoelectric generator system of claim 1 wherein the first source of energy is electrical energy tapped from an overhead transmission ground wire.

4. The dual fueled thermoelectric generator system of claim 2 including detecting means for detecting a predetermined low energy level from the overhead transmission ground wire.

5. The dual fueled thermoelectric generator system of claim 2 including detecting means for detecting a predetermined low energy output from the thermopile.

6. The dual fueled thermoelectric generator system of claim 2 including detecting means for detecting a predetermined high energy output from the thermopile.

7. The system of claim 1 in which the first and second converting means include means for converting the first and second sources of energy, respectively, to thermal energy in which the first and second converting means are separate and different in conversion processes.

8. The dual fueled thermoelectric generator system of claim 7 wherein the first means for converting into thermal energy is at least one electric resistance heater.

9. The dual fueled thermoelectric generator system of claim 7 wherein the second source of energy is fossil fuel and the second means for converting into thermal energy is a fossil fuel burner.

10. The dual fueled thermoelectric generator system of claim 9 wherein the fossil fuel is propane gas.

11. The dual fueled thermoelectric generator system of claim 1 wherein the thermopile comprises a plurality of thermocouples.

12. The dual fueled thermoelectric generator system of claim 1 wherein the DC electrical energy produced by a thermopile is applied to at least one fiber optic repeater.

13. The system of claim 1 in which the first source of energy is electrical energy and the second source of energy is chemical energy.

14. A dual fueled thermoelectric generator system for producing DC electrical energy from thermal energy comprising:
    means for tapping electrical energy from an overhead transmission ground wire for producing a non-stable first source of energy;
    first means for converting the first source of energy into thermal energy;
    an auxiliary second source of energy;
    second means for converting the second source of energy into thermal energy including means operable for actuating the second converting means; and
    thermopile means for converting the thermal energy into DC electrical energy.

15. The dual fueled thermoelectric generator system of claim 14 including means for detecting a predetermined event for operating the actuating means.

16. The dual fueled thermoelectric generator system of claim 14 wherein the first converting means includes at least one electric resistance heater for converting the electrical energy into thermal energy.

17. The dual fueled thermoelectric generator of claim 15 including detecting means for detecting a predetermined low energy output from the thermopile.

18. The dual fueled thermoelectric generator of claim 15 including detecting means for detecting a predetermined high energy output from the thermopile.

19. The dual fueled thermoelectric generator of claim 15 including detecting means for detecting a predetermined low energy level from the overhead transmission ground wire.

20. The dual fueled thermoelectric generator system of claim 14 wherein the second source of thermal energy includes a fossil fuel and a fossil fuel burner for converting the fossil fuel into thermal energy.

21. The dual fueled thermoelectric generator system of claim 20 wherein the fossil fuel is propane gas.

22. The dual fueled thermoelectric generator system of claim 14 wherein a thermopile comprises a plurality of thermocouples.

23. The dual fueled thermoelectric generator system of claim 14 wherein the DC electrical energy produced by a thermopile is applied to at least one fiber optic repeater.

24. A method for producing DC electrical energy from dual sources of energy wherein the first and second sources of energy are separate and different in kind from each other and having at least one thermopile producing DC electrical energy from thermal energy comprising the steps of:
  (a) converting the first source of energy into thermal energy and applying the thermal energy to said thermopile;
  (b) operably converting the second source of energy into thermal energy and applying the thermal energy to said thermopile; and
  (c) converting the first and second sources of energy, respectively, into thermal energy in which the conversion processes are separate and different in kind.

25. The method of claim 24 in which step (a) includes the step of tapping electrical energy from an overhead transmission ground wire for providing the first source of energy.

26. The method of claim 25 wherein step (b) includes the step of providing an actuating signal in response to detection of a predetermined low energy level on the overhead transmission ground wire.

27. The method of claim 24 wherein step (b) includes the step of providing an actuating signal in response to detection of a predetermined low energy output from the thermopile.

28. The method of claim 24 wherein step (b) includes the step of providing an actuating signal in response to detection of a predetermined high energy output from the thermopile.

29. The method of claim 24 wherein the conversion of step (a) includes the step of applying electric energy to at least one electric resistance heater.

30. The method of claim 24 wherein the conversion of step (b) includes the combustion of a fossil fuel in a fossil fuel burner.

31. The method of claim 24 in which the first source of energy is electrical energy and the second source of energy is chemical energy.

32. A dual fueled thermoelectric generator system using first and second sources of energy which are separate and different in kind from each other and having at least one thermopile producing DC electrical energy from thermal energy comprising:
  first means for converting the first source of energy into thermal energy and applying the thermal energy to said thermopile; and
  second means for converting the second source of energy into thermal energy and applying the thermal energy to said thermopile, the first and second converting means include means for converting the first and second sources of energy, respectively, into thermal energy in which the conversion processes are separate and different in kind.

33. The system of claim 32 in which the first source of energy is electrical energy and the second source of energy is chemical energy.

34. A method for producing DC electrical energy from dual sources of energy wherein the first and second sources of energy are separate and different in kind from each other and having at least one thermopile producing DC electrical energy from thermal energy comprising the steps of:
  (a) converting the first source of energy into thermal energy and applying the thermal energy to said thermopile;
  (b) operably converting the second source of energy into thermal energy and applying the thermal energy to said thermopile; and
  (c) actuating the second conversion of the second source of energy into thermal energy.

35. The method of claim 34 in which the first and second converting steps include steps for converting the first and second sources of energy, respectively, to thermal energy in which the first and second converting steps are separate and different in conversion processes.

36. The method of claim 34 in which the first source of energy is electrical energy and the second source of energy is chemical energy.

* * * * *